United States Patent [19]
Gabriel et al.

[11] Patent Number: 5,861,342
[45] Date of Patent: Jan. 19, 1999

[54] OPTIMIZED STRUCTURES FOR DUMMY FILL MASK DESIGN

[75] Inventors: Calvin T. Gabriel, Cupertino; Milind G. Weling, San Jose, both of Calif.

[73] Assignee: VLSI Technology, Inc., San Jose, Calif.

[21] Appl. No.: 579,605

[22] Filed: Dec. 26, 1995

[51] Int. Cl.⁶ .......... H01L 21/461; H01L 21/44
[52] U.S. Cl. .......... 438/631; 438/633; 438/697; 438/926
[58] Field of Search .......... 438/631, 697, 438/926, 633, 666, 668, 669, 692

[56] References Cited

U.S. PATENT DOCUMENTS

| | | | |
|---|---|---|---|
| 4,775,550 | 10/1988 | Chu et al. | 427/38 |
| 4,916,514 | 4/1990 | Nowak . | |
| 5,003,062 | 3/1991 | Yen | 437/231 |
| 5,089,442 | 2/1992 | Olmer | 432/235 |
| 5,173,448 | 12/1992 | Yanagi | 437/186 |
| 5,182,235 | 1/1993 | Eguchi | 437/238 |
| 5,278,105 | 1/1994 | Eden et al. . | |
| 5,441,915 | 8/1995 | Lee . | |
| 5,461,010 | 10/1995 | Chen et al. . | |
| 5,470,802 | 11/1995 | Gnade et al. | 437/238 |
| 5,476,817 | 12/1995 | Numata | 437/195 |
| 5,488,015 | 1/1996 | Havemann et al. | 437/195 |
| 5,494,853 | 2/1996 | Lur . | |
| 5,494,854 | 2/1996 | Jain | 437/195 |
| 5,510,293 | 4/1996 | Numata | 437/195 |
| 5,618,757 | 4/1997 | Bothra et al. . | |
| 5,639,697 | 6/1997 | Weling et al. . | |

OTHER PUBLICATIONS

Ichikawa, et al., "Multilevel Interconnect System for 0.35um CMOS Lsi's with Metal Dummy Planarization Process and Thin Tungsten Wirings", Jun. 27–29, 1995 VMIC Conference, 1995 ISMIC—104/95/0254.

*Primary Examiner*—Caridad Everhart
*Attorney, Agent, or Firm*—Hickman & Martine, LLP

[57] ABSTRACT

A method of improving the planarity of spin-on-glass layers in semiconductor wafer processing is disclosed. Gaps in between active conductive traces in a trace layer that exceed a predetermined distance are provided with dummy lines having a specific geometry in order to improve the planarity achieved in subsequently applied spin-on glass layers. In some embodiments, the predetermined distance is greater than approximately 1 micrometer, as for example in the range of approximately 3 to 6 micrometers. In some applications, both the active conductive traces and the dummy lines are formed from a metallic material that is deposited in one single step with a passivation layer being deposited over both the conductive traces and the raised lines prior to application of the spin-on glass layer.

19 Claims, 7 Drawing Sheets

OPTIMIZED STRUCTURES FOR DUMMY FILL MASK DESIGN

BACKGROUND OF THE INVENTION

1. Field of Invention

The present invention relates to methods of fabricating integrated circuits. More particularly the use of oriented dummy lines to fill gaps in trace layers prior to a spin-on-glass process is disclosed to improve layer planarity during fabrication.

2. Description of the Prior Art

Maintaining the planarity of a semiconductor wafer surface during fabrication is crucial to insure that there is no accidental coupling of active conductive traces between different layers of active conductive traces on integrated circuits housed on the wafer, and further to provide a surface with a constant height for any subsequent lithography processes. There are many processes which are intended to improve the planarity of a wafer surface during fabrication.

Spin-on glass (SOG) etchback is one process commonly used to improve the planarity of a semiconductor wafer surface during fabrication. In the SOG etchback process, SOG is dispensed at the centerpoint of a semiconductor wafer, which contains a plurality of integrated circuits, while the wafer is rotated in order to spread the SOG as evenly as possible. As a result of its viscosity, SOG flows on the wafer in a weak spiral pattern which can be approximated as a center-to-edge flow pattern. The SOG is intended to fill gaps formed between active metal traces on the surface of the wafer. After the SOG has been deposited, it is etched back to expose portions of at least some of a passivation layer that covers the metal trace layer. The purpose of exposing the passivation layer is to enable a via etch process to take place without vias having to be created through a layer of SOG.

It has been observed that the effectiveness of SOG etchback is dependent on the underlying pattern of metal lines and spaces on the surface of an integrated circuit. SOG easily fills in narrow spaces, but cannot adequately fill in large gaps while maintaining both the nominal thickness of SOG over the portions of the passivation layer which overlay the active conductive traces, and the nominal thickness of SOG on a flat surface away from topography. By way of example, in some existing submicron devices, the SOG over the portions of the passivation layer which overlay the active conductive traces may be in the range of approximately 500–1000 Angstroms while the SOG in areas that do not overlie traces may be on the order of approximately 3000 Angstroms. Thus, while SOG can improve local planarity, i.e. planarity between metal lines which are close in spacing, it is not as efficient in improving global planarity, i.e. planarity between metal lines which are far apart. This leads to problems during optical lithography when the depth of focus is inadequate for surfaces which do not have a consistent height.

FIG. 1 is a diagranmmatic illustration of the surface of a semiconductor wafer having a substrate 10 on which metal lines 12, 14, 16 are situated. A passivation layer 18 is deposited over the metal lines. A layer of SOG 30 is then deposited over the passivation layer. In areas where adjacent metal lines are relatively closely spaced (such as gap 26, which is formed between traces 14 and 16), the gaps between adjacent lines are adequately filled by the SOG 30. However in areas where adjacent metal lines are spaced relatively farther apart (such as gap 28 between traces 12 and 14), indentations 29 tend to be formed in the glass layer 30. Local planarity between metal lines 14 and 16 is improved, while global planarity between metal lines 12 and 14 shows marginal improvement.

While the conventional SOG etchback process is effective in achieving local planarity on the surface of a semiconductor wafer, there is ample room for improvements which can be made to achieve planarity across the entire surface of a semiconductor wafer using the SOG etchback process.

SUMMARY OF THE INVENTION

To achieve the foregoing and other objects and in accordance with the purpose of the present invention, gaps between active conductive traces in a trace layer that exceed a predetermined distance are provided with dummy lines having a specific geometry in order to improve the planarity achieved in subsequently applied spin-on glass layers. More specifically, in a method aspect of the invention, an active trace layer is created by forming a multiplicity of active conductive traces on a substrate of the wafer. The respective active conductive traces are arranged to electrically couple associated elements on the wafer when the processing is completed. The active conductive traces are arranged such that there are gaps exceeding a predetermined distance between at least some adjacent ones of the traces. A multiplicity of raised lines are also formed on the substrate in the gaps. The raised lines differ from the active conductive traces in that they are not arranged to electrically couple any elements on the wafer and they are arranged in a predefined pattern with respect to the wafer. In some preferred embodiments the raised lines are formed from the same material as the active conductive traces and are laid down at the same time as the active conductive traces.

After the active conductive traces have been laid, a passivation layer is deposited over the active conductive traces to electrically insulate the active conductive traces. A layer of glass is then spun over the passivation layer to provide a planar surface on the wafer. With this arrangement, the glass layer is superimposed over the active conductive traces and the raised lines. After the glass layer has been spun into place, it is etched to expose at least portions of the passivation layer to permit the formation of vias between the trace layer and elements superimposed above the passivation layer when further processing is done on the wafer.

The predefined pattern exhibited by the raised lines may take a variety of geometries. By way of example, they may be arranged concentrically about a centerpoint of the wafer. The lines may be arranged in concentric polygons such as rectangles, concentric circles or other suitable forms. Alternatively, the raised lines may all be substantially parallel. In some embodiments, the raised lines are formed from a multiplicity of dots and in others they are more solid line segments, although it is expected that the lines would very rarely be complete across a wafer or about a centerpoint. These geometries tend to further improve the planarity of the wafer surface when the spin on glass step is completed. Some of the described geometries such as the concentric rectangles and parallel lines have the advantage of permitting a plurality of integrated circuits to be formed on the wafer using a single reticle.

In a first preferred embodiment, the aforementioned predetermined distance is greater than approximately 1 micrometer, as for example in the range of approximately 3 to 6 micrometers. In a method relating to the first embodiment, both the active conductive traces and the raised lines are formed from a metallic material that is deposited in one single step with the passivation layer being deposited over both the conductive traces and the raised lines. In a second embodiment, the raised lines may be formed from a nonconductive material using a masking technique. Integrated circuits formed using such techniques are also described.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1:
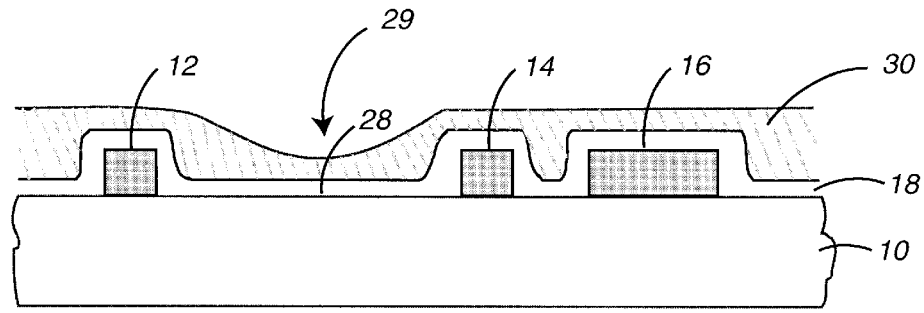
FIG. 1 is a diagrammatic side view of a wafer segment illustrating the indentations that occur in conventional spin-on glass application when the active metallic traces that the glass is intended to cover are spaced too far apart.
Figure 2:
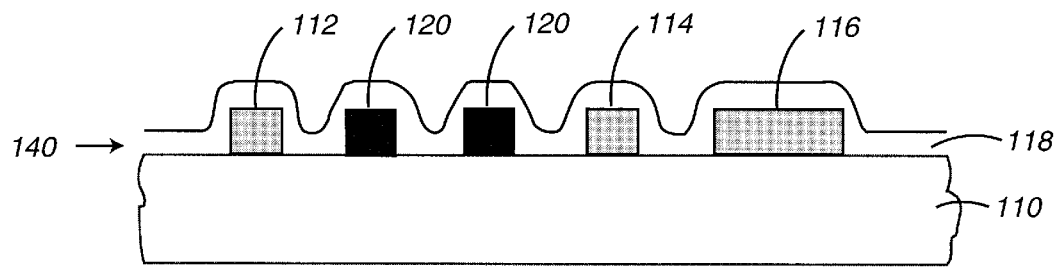
FIG. 2 is a diagrammatic side view of a wafer segment illustrating the use of dummy lines in the large gaps between active metal traces in accordance with a first embodiment of the present invention.

The present invention will now be described in detail with reference to a few preferred embodiments thereof as illustrated in the accompanying drawings. Referring initially to FIG. 2, as is well known in the wafer processing art one technique that is often used in the production of integrated circuits is the creation of an active trace layer 140 that includes a multiplicity of active conductive traces 112, 114, 116. In the first embodiment as shown, the trace layer 140 is formed over a substrate 110. The substrate typically has a large number of electrical elements formed therein which the active trace layer is used to at least partially interconnect. The substrate may include any number of distinctly processed layers and may in some circumstances include one or more other trace layers.

As is common in the prior art, the spacing between adjacent traces will vary greatly in accordance with the needs of a particular design. In the segment of the embodiment shown in FIG. 2, the active trace layer includes a plurality of active conductive traces 112, 114, 116 and dummy raised lines 120 that are situated in regions where the spacing between adjacent active traces exceeds a predetermined threshold distance. The magnitude of the threshold may vary widely in accordance with the needs of a particular system. By way of example, in most current applications, the threshold will be greater than approximately 1 micrometer, as for example in the range of 3 to 6 micrometers. The active conductive traces may be formed from any suitable material, but are typically a metallic material such as an aluminum alloy or a copper alloy. In the embodiment shown, the raised lines are formed from the same material as the active conductive traces and are applied in the same step to minimize processing. The raised lines differ from the active conductive traces primarily in that they are not used to electrically couple other elements in the integrated circuit.

The dummy raised lines 120 are situated in regions where the spacing between adjacent active conductive traces 112, 114, 116 exceeds the predetermined threshold distance. The purpose of adding dummy raised lines 120 is to help achieve planarity on the surface of a integrated circuit. A spin-on glass (SOG) etchback process is commonly used to achieve planarity on the surface of a semiconductor wafer. It has been observed that the effectiveness of SOG etchback is dependent on the underlying pattern of metal lines and spaces on the surface of an integrated circuit. SOG easily fills in narrow spaces, but cannot adequately fill in large gaps while maintaining both the nominal thickness of SOG over the portions of the passivation layer which overlay the active conductive traces, and the nominal thickness of SOG on a flat surface away from topography.

Figure 3A:
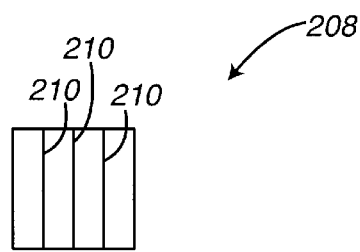
FIG. 3A is a diagrammatic top view of the surface of a reticle with parallel dummy lines in accordance with a first orientation of the present invention.
Figure 3B:
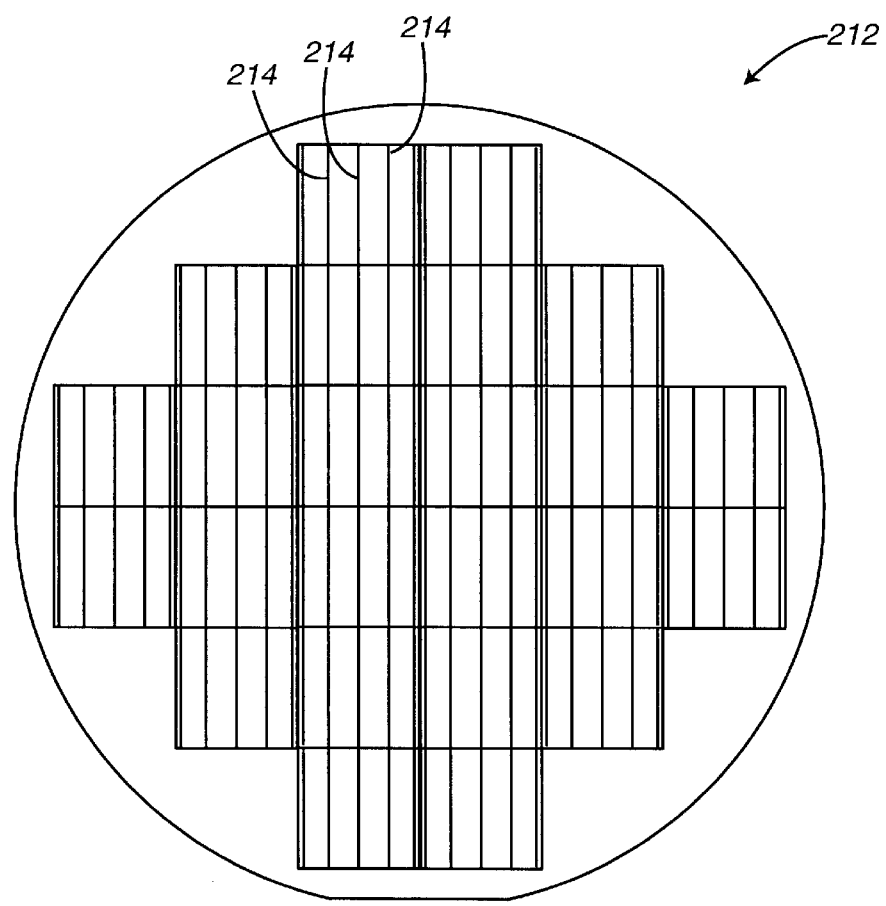
FIG. 3B is a diagrammatic top view of the surface of a semiconductor wafer with parallel dummy lines formed by the reticles of FIG. 3A.

FIGS. 3A and 3B are diagrammatic top views of the surface of a reticle with parallel dummy lines and the surface of a wafer formed with the reticle, respectively, in accordance with a first orientation of the present invention. The reticle 208 includes line segments 210 which are laid out in a parallel orientation. In the illustration, only the parallel line segments of the reticle 208 are shown. As will be appreciated by those skilled in the art, the reticle 208 also includes patterns (not shown) which relate to particular integrated circuits. Thus, in actuality, line segments 210 are interspersed around portions of the traces of the integrated circuits.

A semiconductor wafer 212 is shown with the pattern of parallel lines 214 as stepped from the reticle 208. The wafer 212 with the pattern of parallel raised lines 214 improves the distribution of SOG due to the fact that gaps exceeding a predetermined distance between adjacent active conductive traces have been eliminated by the use of raised lines 214. The absence of relatively large gaps enables the SOG to flow more evenly across the surface of the wafer 212, thereby allowing the SOG to more precisely maintain nominal thicknesses over the entire surface of the wafer 212.

Although the described dummy parallel line orientation works much better than conventional SOG techniques that do not use dummy lines, it has also been observed that when the flow of the SOG is parallel to the raised lines 214 on the wafer 212, channeling of the SOG can occur, as the space between two adjacent parallel raised lines 214 forms a trench. This channeling may result in a somewhat uneven distribution of SOG on the surface of the wafer 212, albeit better than applications that do not make use of the dummy lines.

As will be appreciated by those skilled in the art, SOG is dispensed at the centerpoint of a semiconductor wafer, while the wafer is rotated in order to spread the SOG as evenly as possible. Due to the viscosity of the SOG, the flow of SOG on a wafer is in the form of a weak spiral flow pattern which can be approximated as a center-to-edge flow pattern. For a weak spiral flow pattern, the ideal solution for a pattern of raised lines on a semiconductor wafer would be a series of raised lines which are always perpendicular to the flow of the SOG. Raised lines which are perpendicular to the direction of the flow of SOG impede the center-to-edge flow of the SOG and prevent channeling of the SOG, thereby resulting in the SOG being spread more evenly between groups of raised lines over the entire surface of a semiconductor wafer.

Figure 4:
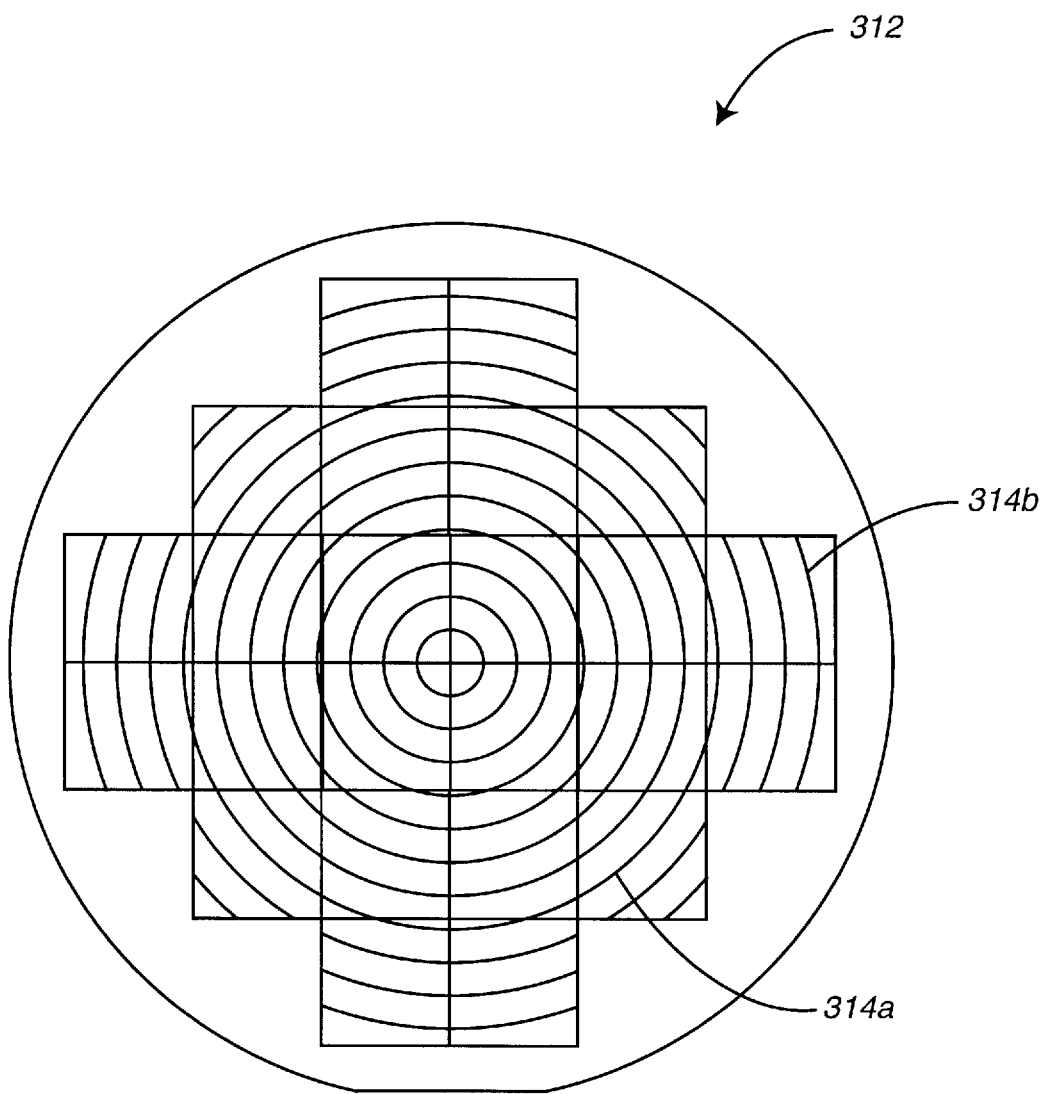
FIG. 4 is a diagrammatic top view of the surface of a semiconductor wafer with concentric circles of dummy lines in accordance with a second orientation of the present invention.

FIG. 4 is a diagrammatic top view of the surface of a semiconductor wafer with concentric circles, in accordance with a second orientation of the present invention. A semiconductor wafer 312 is shown with a pattern of lines formed as concentric circles 314a and arcs 314b about the centerpoint of the wafer 312. The arcs 314b may in essence be considered to be non-continuous, or incomplete, portions of concentric circles 314. The curved lines are interspersed around portions of the circuitry relating to integrated circuits on the wafer. Using the approximation that the flow pattern of SOG is a center-to-edge flow pattern, a series of raised lines of concentric circles 314 about the centerpoint of the wafer 312 is a good approximation to a pattern of lines which are always perpendicular to the flow of SOG.

Although the concentric circle orientation works well to eliminate the channeling problem exhibited in the first orientation, it tends to be an expensive solution. Due to the curvature of the lines, the use of a pattern of concentric circles 314 calls for an array of reticles to be created. The use of an array of reticles requires that each of the reticles be individually stepped across the appropriate part of a wafer using lithography equipment. Configuring the lithography equipment to utilize a plethora of reticles is costly and time-consuming and, therefore, is impractical from a manufacturability standpoint in many applications.

Figure 5A:
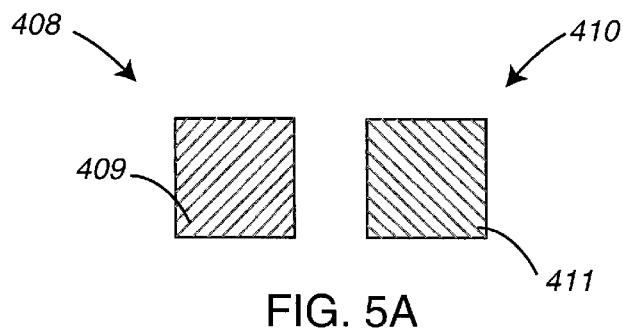
FIG. 5A are diagrammatic top views of the surfaces of two reticles with parallel dummy lines at 45 degree angles in accordance with a third orientation of the present invention.
Figure 5B:
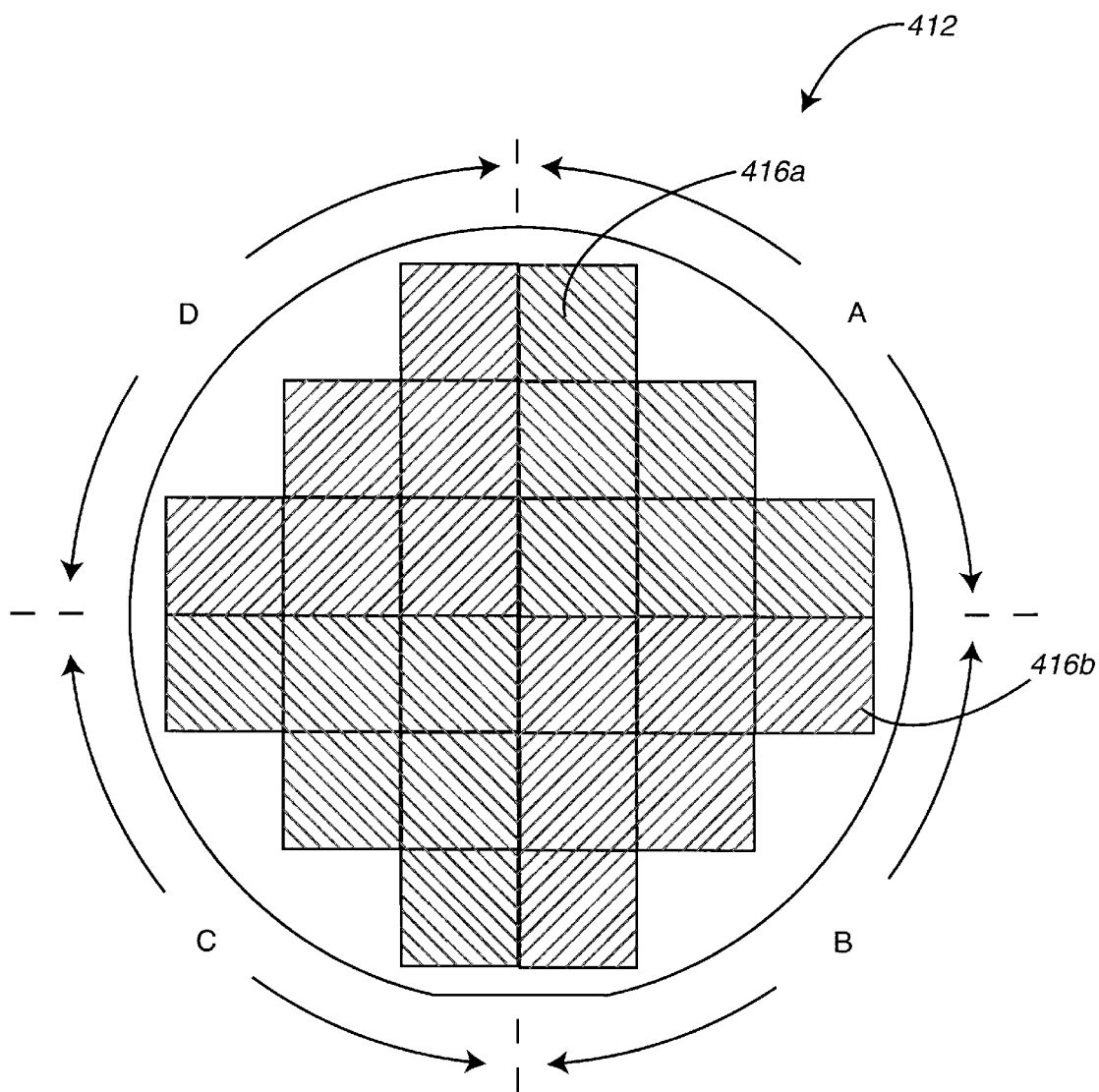
FIG. 5B is a diagrammatic top view of the surface of a semiconductor wafer with concentric rectangles of dummy lines formed by the reticles of FIG. 5A.

FIGS. 5A and 5B are diagrammatic side views of the surfaces of two reticles with angled parallel lines and the surface of a wafer with concentric rectangles, in accordance with a third orientation of the first embodiment of the present invention. In this orientation, reticles 408 and 410 include line segments 409 and 411, respectively, arranged in a parallel manner. Unlike the line segments 210 on the reticle 208 of a previous orientation as illustrated in FIG. 3A, the line segments 409 on the reticle 408, and the line segments 411 on the reticle 410, do not form right angles (the angles formed are 45 degree angles in this orientation) with two sides of their respective reticles as shown in FIG. 5A. It should be clear that parallel line segments 409 and 411 are interspersed among the active conductive traces (not shown) of the integrated circuit patterns (not shown) on reticles 408 and 410, respectively.

Reticles 408 and 410 are stepped across a semiconductor wafer 412 to produce a pattern of rectangles which are concentric to the centerpoint of the wafer 412. To achieve the pattern of rectangles, reticle 408 is stepped across the wafer 412 in quadrants B and D, while reticle 410 is stepped across the wafer 412 in quadrants A and C.

The orientation illustrated in FIGS. 5A and 5B provides an approximation to the second orientation shown in FIG. 4. In FIG. 4, the wafer 312 contains lines 314 in concentric circles. FIGS. 5A and 5B show the wafer 412 with lines 416a formed in concentric rectangles and other lines 416b which may be considered to be portions of non-continuous concentric rectangles. These concentric rectangles 416 are an approximation of the concentric circles 314 which were oriented to always be approximately perpendicular to the flow of SOG. In lieu of the array of reticles which would be required to form concentric circles of lines 314 on a semiconductor wafer 312 as in FIG. 4, this orientation as shown in FIGS. 5A and 5B requires the fabrication of at most two reticles 408 and 410 for use with conventional lithography equipment. In the future, if lithography equipment includes the capability of rotating reticles, it may be possible to create just one reticle which can then be rotated and stepped across an entire wafer to form a pattern of concentric rectangles 416.

It is possible to approximate raised lines of concentric circles in general as raised lines of concentric polygons. The orientation which involves the use of raised lines of concentric rectangles 416 requires fewer reticles 408, 410 to be created than an orientation which involves any other type of polygon. It should be apparent to those skilled in the art that although the current orientation uses rectangles to approximate concentric circles, the use of concentric polygons in general instead of rectangles in particular would also be an acceptable approximation of concentric circles and would not represent a departure from the spirit or the scope of the present invention.

Figure 6A:
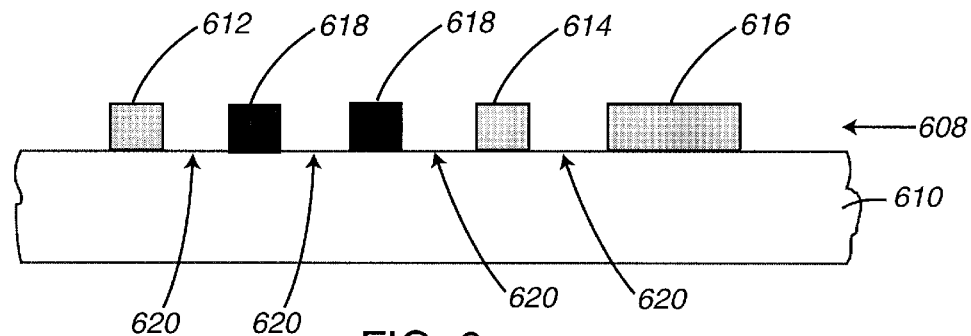
FIG. 6a–d are diagrammatic side views of a wafer segment which illustrate the steps in creating a planar surface on a semiconductor wafer using dummy raised lines created from metal in accordance with the first preferred embodiment of the present invention.
Figure 6B:
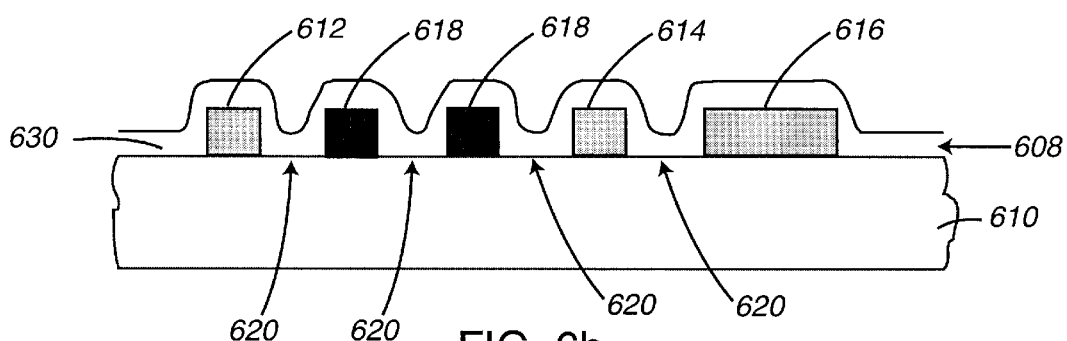

Referring next to FIGS. 6a through 6d, a method of forming the dummy lines illustrated in FIG. 2 will be described. FIGS. 6a through 6d are diagrammatic side views of a wafer segment on which raised lines, which are used as dummy fill lines, are situated on the same layers as active conductive traces. In this method, raised lines 618 are inserted into gaps which exceed a predetermined threshold distance between adjacent active conductive traces 612, 614, 616 on the trace layer 608 of a semiconductor substrate 610 as illustrated in FIG. 6a. The material from which the raised lines 618 are formed was previously described with respect to FIG. 2. In some variations of this method, raised lines 618 may be formed from a multiplicity of dots. In other variations, raised lines 618 may be solid line segments, although it is expected that the raised lines 618 would very rarely be complete across a wafer or about the centerpoint of a wafer. A passivation layer 630, such as an oxide layer, is deposited over the raised lines 618 and the active conductive traces 612, 614, 616 as illustrated in FIG. 6b, in order to electrically insulate the active conductive traces 612, 614, 616.

Figure 6C:
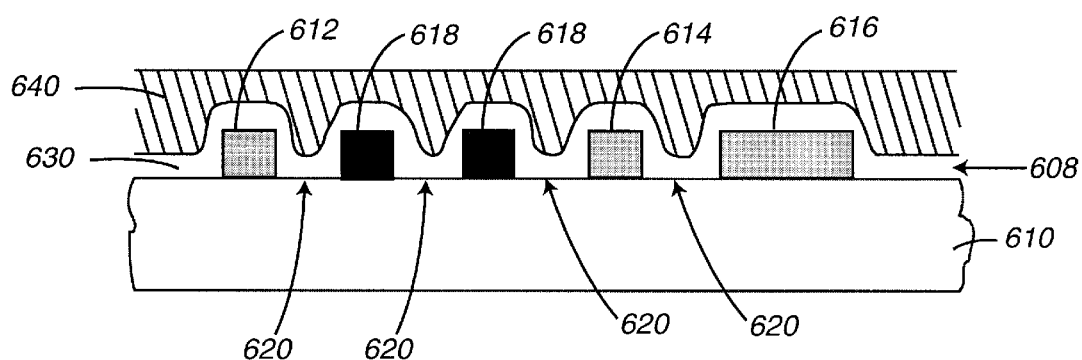
Figure 6D:
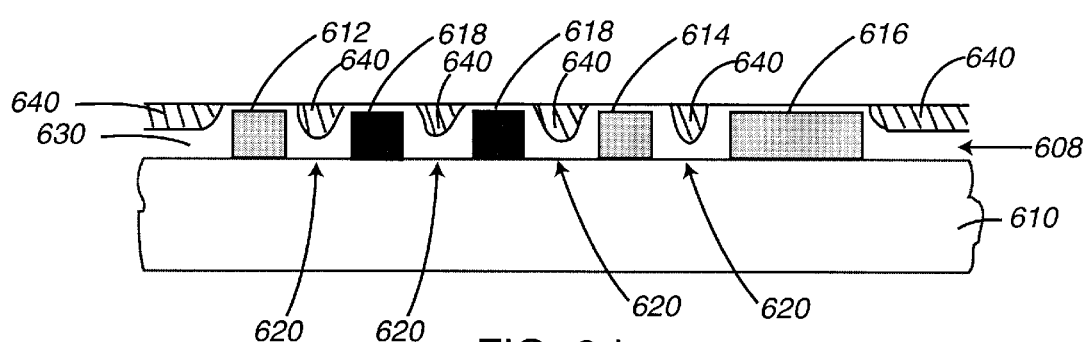

A layer of SOG 640 is deposited and spun over the passivation layer 630 to fill in gaps 620 which do not exceed a predetermined threshold distance between the raised lines 618 and the active conductive traces 612, 614, 616 as illustrated in FIG. 6c. Because any gaps which exceeded a predetermined threshold distance were eliminated through the use of raised lines 618, SOG 640 is able to fill in the gaps 620 evenly and create a planar surface. After the layer of SOG 640 is deposited, the SOG layer 640 is etched back to expose portions of at least some of the passivation layer 630 that covers the trace layer 608. This process results in a planar surface on the semiconductor surface, and therefore, the surface of the integrated circuit as illustrated in FIG. 6d.

Figure 7A:
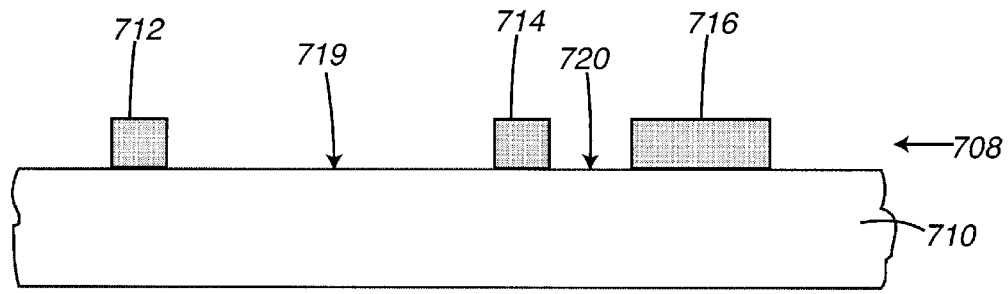
FIG. 7a–f are diagrammatic side views of a wafer segment which illustrate the steps in creating a planar surface on a semiconductor wafer using dummy raised lines created from a passivation layer in accordance with a second preferred embodiment of the present invention.
Figure 7B:
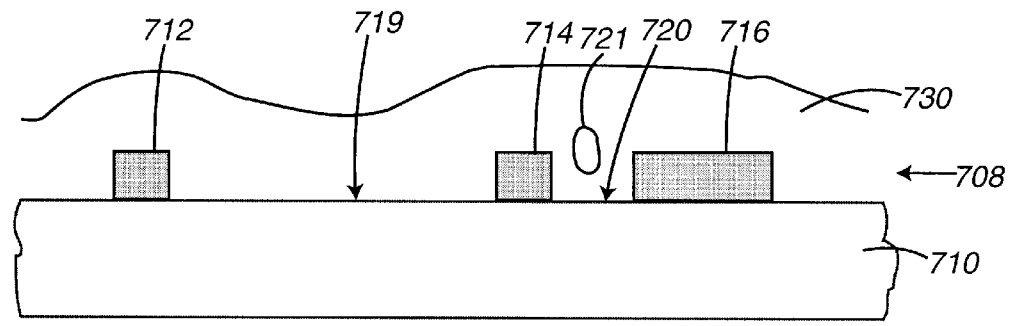
Figure 7C:
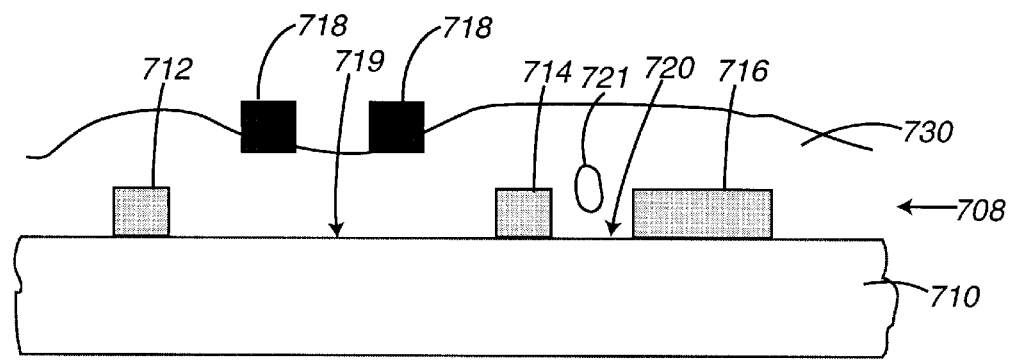
Figure 7D:
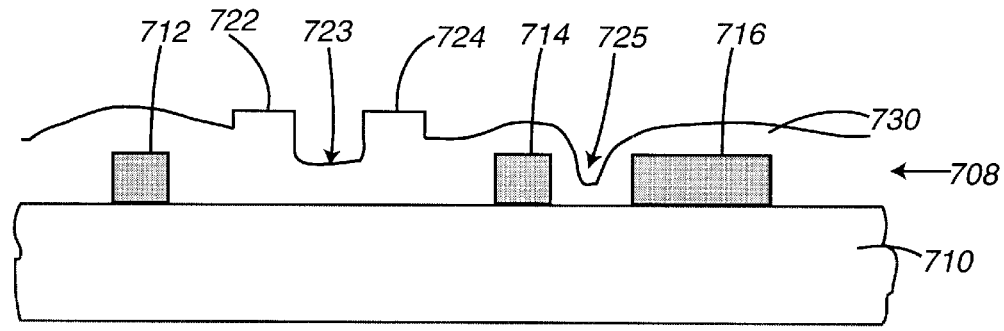

FIGS. 7a through 7e are diagrammatic side views of a second preferred embodiment of the present invention; this embodiment relates to a method for creating raised lines, which are used as dummy fill lines, in the passivation layer on the surface of an integrated circuit. In this embodiment, raised lines are created first by depositing a thicker passivation layer 730 than normally used over active conductive traces 712, 714, 716 on the trace layer 708 situated on a semiconductor substrate 710, as illustrated in FIG. 7b. The passivation layer 730 should be thick enough to at least sufficiently fill in the gaps 719, 720 between the active conductive traces 712, 714, 716. Second, a mask 718, (created from a photoresist material in this embodiment) is placed over the passivation layer 730 in sections where gaps exceeding a predetermined threshold distance (such as gap 719 between active conductive traces 712 and 714) in the trace layer 708 are located as illustrated in FIG. 7c. Last, the passivation layer 730 is etched, and the mask 718 is removed, leaving raised lines 722, 724 created from the passivation layer as illustrated in FIG. 7d. The raised lines 722, 724 are created underneath where the mask 718 was placed, due to the fact that the mask prevents etching of the passivation layer 730 from occurring underneath it, while the remainder of the passivation layer 730 is etched. In some variations of this embodiment, raised lines 722, 724 may be formed from a multiplicity of dots. In other variations, raised lines 722, 724 may be solid lines, although the raised lines 722, 724 are typically not complete across a wafer or about the centerpoint of a wafer.

Figure 7E:
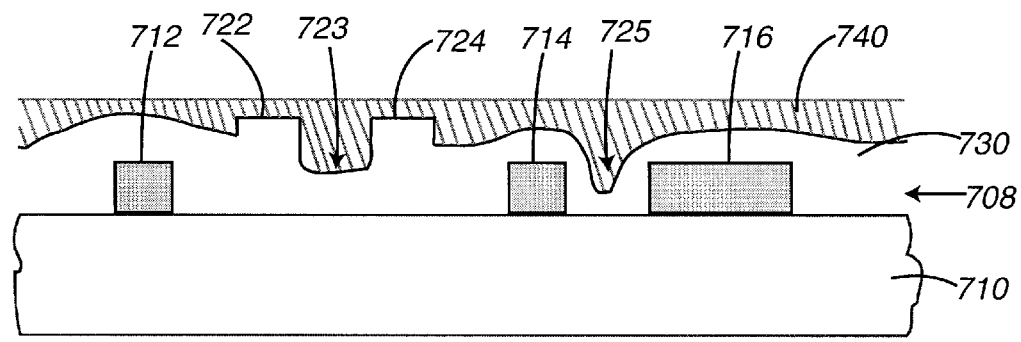
Figure 7F:
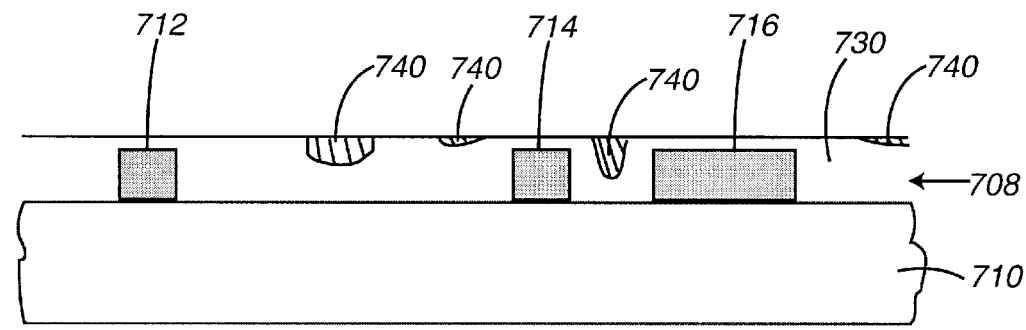

With the raised lines 722, 724 in place, a layer of SOG 740 is deposited over the passivation layer 730 as illustrated in FIG. 7e. The surface of the SOG layer 740 is planar because any gaps exceeding a predetermined threshold distance (such as gap 719 between active conductive trace 712 and 714) have been filled with raised lines 722, 724, and the SOG is able to fill in any smaller gaps 720, 723. After the layer of SOG 740 has been deposited, the SOG layer 740 is etched back to expose at least portions of the passivation layer 730 as illustrated in FIG. 7f. The SOG etchback process also leaves the surface of the substrate 710 planar.

When a thick passivation layer 730 is deposited as shown if FIG. 7b, there is the possibility that a void (such as void 721) may form in the layer between closely spaced active conductive traces (such as active conductive traces 714 and 716). Any void (such as void 721) formed in the passivation layer 730 is exposed (void 725 is an exposed void) during the etching process of the passivation layer 730 as shown in FIG. 7d. Any exposed void (such as exposed void 725) is subsequently filled once a layer of SOG 740 has been deposited as shown in FIG. 7e.

Although only a few embodiments of the present invention have been described, it should be understood that the present invention may be embodied in many other specific forms without departing from the spirit or scope of the invention. In particular, dummy fill lines may be implemented for use with any spin-on process in order to achieve planarity on the surface of a semiconductor wafer. While only a few orientations of dummy lines have been disclosed with respect to the present invention, it should be clear that other orientations can be implemented without departing from the spirit or the scope of the invention. Some possible orientations include, but are not limited to, patterns of concentric polygons, patterns of staggered line segments, and any combination of the disclosed patterns.

Although the predetermined threshold distance is stated as being greater than approximately 1 micrometer, as in the range of approximately 3 to 6 micrometers, this particular threshold may be raised and lowered as necessary, without departing from the spirit or the scope of the invention. For example, if indentations in the SOG layer are observed in gaps which do not exceed the 3 to 6 micrometer threshold distance in width, the threshold distance can be lowered as necessary. Therefore, the present examples are to be considered as illustrative and not restrictive, and the invention is not to be limited to the details given herein, but may be modified within the scope of the appended claims.

We claim:

1. In the manufacture of integrated circuits, a method of processing a semiconductor wafer having at least one integrated circuit, the method comprising the steps of:
    determining a threshold gap distance;
    forming a multiplicity of active conductive traces on a substrate of the wafer, the active conductive traces each being arranged to electrically couple associated elements of an associated integrated circuit on the wafer, there being gaps exceeding the threshold gap distance between at least some adjacent ones of the traces, wherein the threshold gap distance is substantially uniform across the substrate;
    forming a multiplicity of raised lines on the substrate in the gaps which exceed the threshold gap distance, wherein the raised lines are not arranged to electrically couple any elements in the integrated circuit;
    depositing a passivation layer over the active conductive traces to electrically insulate the active conductive traces;
    spinning a layer of glass over the passivation layer to provide a planar surface on the wafer, the glass layer being superimposed over the active conductive traces and the raised lines; and,
    etching the glass layer to expose at least portions of the passivation layer.

2. A method as recited in claim 1 wherein the threshold gap distance is greater than approximately 1 micrometer.

3. A method as recited in claim 2 wherein the threshold gap distance is in the range of approximately 3 to 6 micrometers.

4. A method as recited in claim 1 wherein the raised lines are formed from the same material as the active conductive traces and are applied at the same time as the active conductive traces, the passivation layer being arranged to cover the raised lines in addition to the active conductive traces.

5. A method as recited in claim 4 wherein:
    the active conductive traces and the raised lines are formed from a metallic material; and,
    the passivation layer is formed from an oxide material.

6. In the manufacture of integrated circuits, A method of processing a semiconductor wafer having at least one integrated circuit, the method comprising the steps of:
    forming a multiplicity of active conductive traces on a substrate of the wafer, the active conductive traces each being arranged to electrically couple associated elements of an associated integrated circuit on the wafer, there being gaps exceeding a threshold gap distance between at least some adjacent ones of the traces;
    forming a multiplicity of raised lines on the substrate in the gaps, wherein the raised lines are not arranged to electrically couple any elements in the integrated circuit;
    depositing an passivation layer over the active conductive traces to electrically insulate the active conductive traces;
    masking the passivation layer to define a pattern of lines in the gaps;
    etching the passivation layer to create the raised lines in the passivation layer from the pattern of lines in the gaps;
    spinning a layer of glass over the etched passivation layer to provide a planar surface on the wafer, the glass layer being superimposed over the active conductive traces and the raised lines; and, etching the glass layer to expose at least portions of the etched passivation layer.

7. A method as recited in claim 6 wherein a photoresist material is used in the masking step to define the pattern of lines, the method further comprising the step of removing the photoresist prior to the glass spinning step.

8. A method as recited in claim 1 wherein the raised lines are formed from a multiplicity of dots.

9. A method as recited in claim 1 wherein the raised lines are arranged concentrically about a centerpoint of the wafer.

10. A method as recited in claim 1 wherein the wafer includes a plurality of integrated circuits and the raised lines are oriented such that the active conductive traces and raised lines in a plurality of the integrated circuits may be formed from a single reticle.

11. A method as recited in claim 1 wherein the raised lines are substantially parallel.

12. In the manufacture of intecrated circuits, a method of processing a semiconductor wafer having at least one integrated circuit, the method comprising the steps of:

forming a multiplicity of active conductive traces on a substrate of the wafer, the active conductive traces each being arranged to electrically couple associated elements of an associated integrated circuit on the wafer, there being gaps exceeding a threshold gap distance between at least some adjacent ones of the traces the wafer including a centerpoint and a plurality of integrated circuits;

forming a multiplicity of raised lines on the substrate in the gaps, wherein the raised lines are not arranged to electrically couple any elements in the integrated circuit the raised lines being formed in the wafer in concentric circles about the centerpoint;

depositing a passivation layer over the active conductive traces to electrically insulate the active conductive traces;

spinning a layer of glass over the passivation layer to provide a planar surface on the wafer, the glass layer being superimposed over the active conductive traces and the raised lines; and etching the glass layer to expose at least portions of the passivation layer.

13. In the manufacture of intecrated circuits, a method of processing a semiconductor wafer having at least one integrated circuit, the method comprising the steps of:

forming a multiplicity of active conductive traces on a substrate of the wafer, the active conductive traces each being arranged to electrically couple associated elements of an associated integrated circuit on the wafer, there being gaps exceeding a threshold gap distance between at least some adjacent ones of the traces the wafer including a centerpoint and a plurality of integrated circuits;

forming a multiplicity of non-intersecting raised lines on the substrate in the gaps, wherein the raised lines are not arranged to electrically couple any elements in the integrated circuit the raised lines being formed in the wafer in a plurality of non-intersecting concentric polygons about the centerpoint;

depositing a passivation layer over the active conductive traces to electrically insulate the active conductive traces;

spinning a layer of glass over the passivation layer to provide a planar surface on the wafer, the glass layer being superimposed over the active conductive traces and the raised lines; and etching the glass layer to expose at least portions of the passivation layer.

14. A method as recited in claim 13 wherein the concentric polygons are rectangles.

15. A method as recited in claim 1 wherein the multiplicity of active conductive traces form a first active layer of the wafer, the method further comprising the steps of forming additional active layers on the wafer by repeating the steps of claim 1 to form a plurality of layered active layers on the wafer.

16. A method as recited in claim 6 wherein the raised lines are substantially parallel.

17. A method as recited in claim 6 wherein:

the wafer includes a centerpoint and a plurality of integrated circuits; and the raised lines are formed in the wafer in concentric circles about the centerpoint.

18. A method as recited in claim 6 wherein:

the wafer includes a centerpoint and a plurality of integrated circuits; and the raised lines are formed in the wafer in a plurality of concentric polygons about the centerpoint.

19. A method as recited in claim 6 wherein the multiplicity of active conductive traces form a first active layer of the wafer, the method further comprising the steps of forming additional active layers on the wafer by repeating the steps of claim 6 to form a plurality of layered active layers on the wafer.

* * * * *